US009439333B2

(12) United States Patent
Daughtry, Jr. et al.

(10) Patent No.: US 9,439,333 B2
(45) Date of Patent: Sep. 6, 2016

(54) HEAT-DISSIPATING EMI/RFI SHIELD

(71) Applicant: Genesis Technology USA, Inc., Norcross, GA (US)

(72) Inventors: Earl Anthony Daughtry, Jr., Lawrenceville, GA (US); Ronald L. Hodge, Flowery Branch, GA (US)

(73) Assignee: Genesis Technology USA, Inc., Lawrenceville, GA (US)

( * ) Notice: Subject to any disclaimer, the term of this patent is extended or adjusted under 35 U.S.C. 154(b) by 166 days.

(21) Appl. No.: 14/152,555

(22) Filed: Jan. 10, 2014

(65) Prior Publication Data

US 2015/0201533 A1 Jul. 16, 2015
US 2016/0165764 A9 Jun. 9, 2016

Related U.S. Application Data

(60) Provisional application No. 61/752,674, filed on Jan. 15, 2013.

(51) Int. Cl.
| | |
|---|---|
| H05K 9/00 | (2006.01) |
| H05K 7/20 | (2006.01) |
| H01L 23/552 | (2006.01) |
| H05K 13/04 | (2006.01) |
| H01L 23/40 | (2006.01) |

(52) U.S. Cl.
CPC ........... *H05K 9/0024* (2013.01); *H01L 23/552* (2013.01); *H05K 7/2039* (2013.01); *H05K 7/20418* (2013.01); *H05K 9/0028* (2013.01); *H05K 9/0032* (2013.01); *H05K 13/0465* (2013.01); *H01L 23/40* (2013.01); *H01L 23/4006* (2013.01); *H01L 2023/4062* (2013.01); *H01L 2924/0002* (2013.01); *Y10T 29/49144* (2015.01)

(58) Field of Classification Search
CPC .................. H05K 9/0032; H05K 7/20418
See application file for complete search history.

(56) References Cited

U.S. PATENT DOCUMENTS

| | | | |
|---|---|---|---|
| 5,596,487 A | 1/1997 | Castaneda et al. | |
| 6,507,101 B1 | 1/2003 | Morris | |
| 7,245,896 B2* | 7/2007 | Seo .......................... | H01Q 1/02 174/377 |
| 7,692,927 B2 | 4/2010 | Jin et al. | |
| 8,081,476 B2* | 12/2011 | Tsao ................... | H05K 7/20454 174/382 |
| 2010/0157544 A1* | 6/2010 | Tsao ..................... | H05K 9/0032 361/720 |
| 2011/0096505 A1 | 4/2011 | Inoue | |

FOREIGN PATENT DOCUMENTS

| | | |
|---|---|---|
| CN | 1471355 | 1/2004 |
| CN | 101340806 | 1/2009 |
| CN | 201222843 | 4/2009 |
| CN | 201248218 | 5/2009 |
| CN | 201491441 | 5/2010 |
| CN | 201536470 | 7/2010 |

OTHER PUBLICATIONS

Translated Chinese Office Action mailed May 5, 2016 for Chinese patent application No. 201410139154.9, a counterpart foreign application of U.S. Appl. No. 14/152,555, 24 pages.

* cited by examiner

*Primary Examiner* — Hung V Ngo
(74) *Attorney, Agent, or Firm* — Lee & Hayes, PLLC; Charles L. Warner

(57) ABSTRACT

A heat-dissipating EMI/RFI shield (100) has a shield base (110), a shield cap (130), and a heat sink (150). The shield base has at least one sidewall (112) which defines an open area (113). At least one mounting leg (114) extends from the sidewall and is affixed to a printed circuit board (200). The shield cap has a collar (136) which defines an opening in the shield cap. The shield cap is configured to be mated to the shield base. The heat sink has a boss (156) extending therefrom. The heat sink is configured to be mated to the shield cap. The boss is configured to protrude at least partially into the opening in the shield cap and to make thermal contact with a selected heat generating component (210) on the printed circuit board.

15 Claims, 10 Drawing Sheets

HEAT-DISSIPATING EMI/RFI SHIELD

CROSS-REFERENCE TO RELATED APPLICATION

This application claims the priority of U.S. Provisional Patent Application No. 61/752,674, filed Jan. 15, 2013, entitled "Heat-Dissipating EMI/RFI Shield," the entire disclosure and contents of which are hereby incorporated by reference herein.

SUMMARY

A heat-dissipating EMI/RFI shield has a shield base, a shield cap, and a heat sink. The shield base has at least one sidewall which defines an open area, and the sidewall has at least one mounting leg extending from it. The shield cap has a collar which defines an opening in the shield cap. The shield cap is configured to be mated to the shield base. The heat sink is configured to be mated to the shield cap. The heat sink has a boss extending therefrom. The boss is configured to protrude at least partially into the opening in the shield cap to make thermal contact with a heat generating component on a printed circuit board to which the heat-dissipating EMI/RFI shield is attached.

DETAILED DESCRIPTION

Figure 1A:
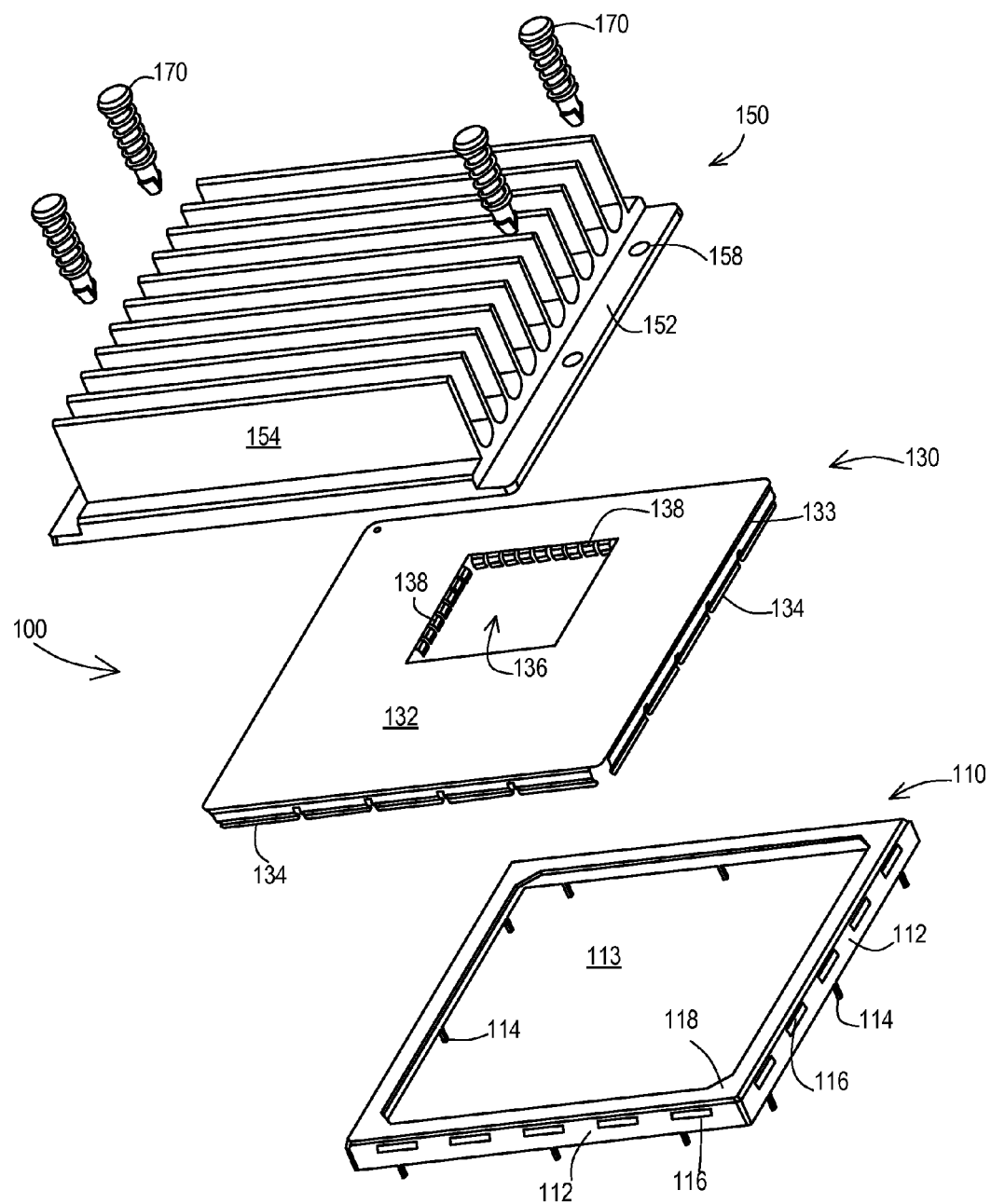
FIGS. 1A and 1B are exploded perspective diagrams showing an exemplary heat-dissipating EMI/RFI shield.

The following Detailed Description is directed to technologies for heat-dissipating EMI/RFI shields (HDSs). The HDSs disclosed herein are configured to be positioned proximate selected electrical circuit components to limit the transmission of energy, such as electromagnetic interference (EMI) and/or radio frequency interference (RFI) emanating from a selected component (SC). An example of an SC is a semiconductor circuit, such as but not limited to a microprocessor, an RF amplifier, a power regulation circuit, etc. In addition, the HDSs disclosed herein are configured to shield the selected components from EMI and/or RFI emanating from other sources. Further, the HDSs disclosed herein are configured to transfer and dissipate heat emanating from the selected components. Still further, the HDSs are preferably electrically grounded, which protects the SC from static electricity discharges.

In the following Detailed Description references are made to the accompanying drawings that form a part hereof, and that are shown by way of illustrated embodiments or examples. Referring now to the drawings, in which like numerals represent like elements throughout the several Figures, aspects of apparatuses, systems, and methodologies for HDSs are described.

Figure 1B:
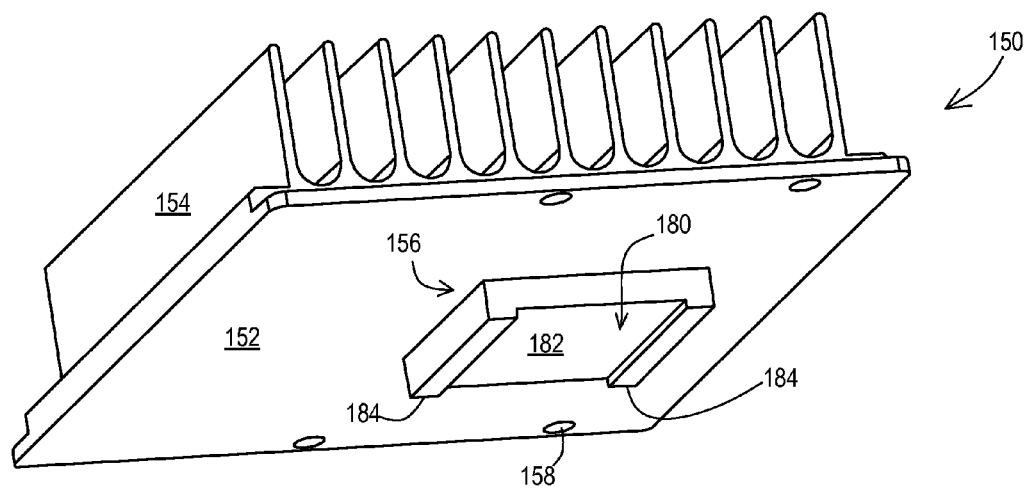

FIGS. 1A and 1B are exploded perspective diagrams showing an exemplary heat-dissipating EMI/RFI shield (herein "HDS 100"). The illustrated HDS 100 includes a shield base or fence 110, a shield cap 130, and a heat sink 150. Engaging components or structures, such as the illustrated push pins 170, may be used to secure the HDS 100 to a desired component or object such as, by way of example and not of limitation, the printed circuit board (PCB) 200 illustrated in FIGS. 2-4.

The illustrated shield base 110 comprises sidewalls 112 which define a central opening area 113, mounting legs 114, sidewall apertures 116, and sidewall shoulders 118. The base shield 110 may be constructed of an electrically conductive material, such as but not limited to light-gauge steel, aluminum, copper, combinations thereof, and the like, and is preferably made of an electrically conductive material which can be soldered. The illustrated HDS 100 is configured to enclose one or more selected heat-generating, EMI/RFI generating, and/or EMI/RFI sensitive components, such as, but not limited to, SC 210, shown in FIGS. 2 and 3. The illustrated shield base 110 is configured to surround the SC 210. The shield base 110 is illustrated as a rectangle, but may be configured in any desired or convenient shape in order to be proximate to and surround the SC 210. The mounting legs 114 mount and preferably ground the shield base 100 to the PCB 200.

The sidewall apertures 116 are configured and positioned to matingly engage components of the shield cap 130. A plurality of sidewall apertures 116 are illustrated at each sidewall 112. Alternative embodiments comprise a lesser or greater number of sidewall apertures 116. Further, some alternative embodiments do not include sidewall apertures 116 at each sidewall 112. In still other alternative embodiments the sidewall apertures 116 may not be used but, rather, other structures may be used that matingly engage components of the shield cap 130, such as but not limited to clips, pins, springs, arms, lips, hooks, combinations thereof, and the like.

The location, configuration, and dimensions of the sidewall shoulder 118 are not critical and may, if desired, be reduced to a size which will not substantially deform when the shield cap 130 and heat shield 150 are attached. The shoulder 118 is preferably sufficiently small enough that it does not substantially inhibit the inflow of hot air for soldering operations.

The illustrated shield cap 130 comprises a shield top 132, shield flanges 133 shown configured as a plurality of leafs 134, a collar 136 defining an opening in the shield cap, and a plurality of spring fingers 138 positioned along the collar 136 perimeter. The shield cap 130 is configured to attach to the shield base 110 and, together with other components described herein, encase the SC 210. The shield cap 130 is illustrated as a rectangle, but alternative embodiments may be configured in any shape whatsoever in order to be proximate the SC 210. Like the shield base 110, the shield cap 130 may be constructed of an electrically conductive material. The collar 136 is configured to receive, and the spring fingers 138 are configured to frictionally engage, a component of the heat sink 150, as described below.

The plurality of leafs 134 are configured to engage a plurality of sidewall apertures 116. In an alternative embodiment, the shield cap 130 releasably engages the shield base 110. In an alternative embodiment the leafs 134 may not be used; rather, other structures may be used to matingly engage components of the shield base 110, such as but not limited to clips, pins, springs, arms, lips, hooks, combinations thereof, and the like. The illustrated HDS 100 comprises a shield base 110 and shield cap 130 that are constructed separately and assembled after the shield base 110 is soldered to the PC board 200 of FIGS. 2-4. In another alternative embodiment the shield base 110 and shield cap 130 may be constructed as a single unit.

The illustrated heat sink 150 comprises a platform 152, heat dissipating fins 154, shoe or boss 156, and apertures 158. The heat sink 150 may be constructed of a thermally conductive material, such as but not limited to aluminum, copper, steel, combinations thereof, and the like. The platform 152 is configured to be positioned adjacent, and preferably in contact with, the shield cap 130, with the shoe 156 inserted through the collar 136 and frictionally engaged, and preferably thermally engaged, with the spring fingers 138.

Alternative embodiments comprise a lesser or greater number of spring fingers 138. Further, some alternative embodiments do not include spring fingers 138 along the entire perimeter of the collar 136. In still other alternative embodiments the spring fingers 138 may not be used; rather, other structures may be used that matingly engage the shoe 156, such as but not limited to flanges, edges, clips, pins, springs, arms, lips, hooks, metallic tape, thermal interface material (TIM) combinations thereof, and the like. The engagement of the spring fingers 138 around the shoe 150 permits shielding EMI and/or RFI at a point close to the SC 210, and permits grounding of the heat sink 150 at a point close to the SC 210.

Figure 1B:
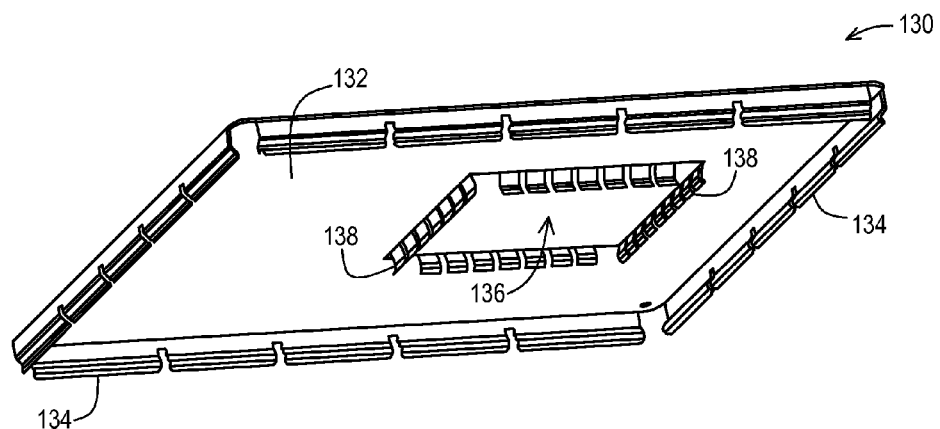
Figure 2:
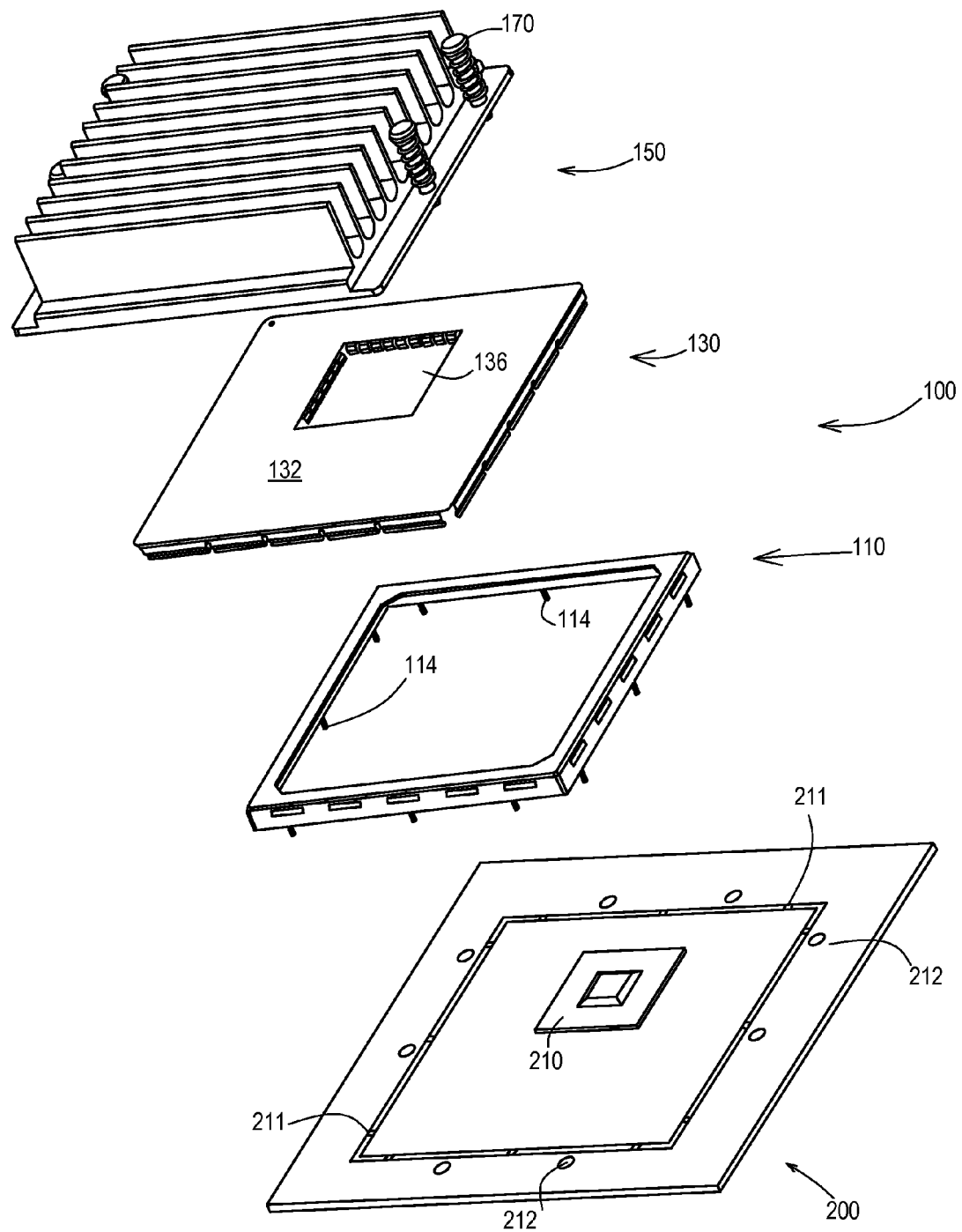
FIG. 2 is a perspective diagram showing an exploded view of the heat-dissipating EMI/RFI shield of FIG. 1.

FIG. 2 is a perspective diagram showing an exploded view of the heat-dissipating EMI/RFI shield 100 of FIG. 1. Connected to the PCB 200 is an SC 210, which may produce and emanate heat and/or EMI and/or RFI. The shield base 110 is shown surrounding the SC 210 and attached to the PCB 200. The illustrated shield base 110 may be structurally and electrically connected to the PCB 200 by inserting the mounting legs 114 into plated through-holes 211 on the PCB 200 that are connected to a conductive layer (not shown) within the PCB 200 such as, but not limited to, a ground plane. The mounting legs 114 are thus mechanically and electrically connected to the conductive layer (not shown) in the PCB 200 during the soldering process.

Engaging components, such as push pins 170, may be used to further secure the HDS 100 to the PCB 200, and provide a compressive fit between the heat sink 150, shield cap 130, shield base 110 and PCB 200. Here the push pins 170 are inserted through the heat sink apertures 158 (FIGS. 1A and 1B), and proximate the shield base 110 are mounting apertures 212 in the PCB 200 (FIG. 2) that are configured to receive and anchor the push pins 170. In alternative embodiments other types of engaging structures and configurations, such as but not limited to screws, bolts, clips, pins, arms, wires, anchors, soldering, combinations thereof, and the like, may be used to further secure the HDS 100 to the PCB 200. Accordingly, the heat sink 150 and/or PCB 200 may comprise various engaging structures and configurations.

Thus, FIGS. 1A, 1B, and 2 show an exemplary heat-dissipating EMI/RFI shield assembly which includes a shield base 110, a shield cap 130 attached to the shield base 110, and a heat sink 150 attached to the shield cap 130. The shield base 110 is electrically connected to a conductive layer of printed circuit board 200, and may be structurally connected to, or may be part of, an electronic device (not shown). Further, the heat sink 150 comprises a shoe 156, and the shoe 156 is electromechanically engaged to the shield cap 130.

As best seen in FIGS. 1B and 2, the heat sink 150 may be mounted to the shield cap 130 by inserting the shoe 156 through the collar 136 such that the spring fingers 138 frictionally engage the shoe 156. The snap-in ends of the push pins 170 are inserted through the PCB apertures 158. The heat sink 150 may thereby be structurally and electrically connected, and grounded, to the shield cap 130, shield base 110, and PCB 200.

The illustrated shoe 156 may be configured as an inverted "U", comprising a channel 180, top 182 and sidewalls 184. The SC 210 rests within the channel 180 and may be proximate to or in direct contact with the top 182 and/or sidewalls 184. In this manner heat generated by and emanated from the SC 210 may be transferred to the heat sink 150 and dissipated from the platform 152 and/or fins 154. Thermal interface materials (not shown) that increase thermal conductance may be applied to fill any gaps between the SC 210 and shoe 156, including top 182 or sidewalls 184. The channel 180 configuration allows for close tolerances between, and contact with, the SC 210. The shoe 156 may also be configured differently as desired to obtain good thermal contact with the SC 210. For example, if the SC 210 has a circular shape, the shoe 156 may also have a corresponding or mating circular shape. In that event, the collar 136 may also have a similar circular shape.

The HDSs 100 illustrated and described herein may perform a plurality of functions. By way of example and not limitation, the HDS 100 limits the transmission of EMI and/or RFI emanating from the SC 210. The HDS 100 may also shield the SC 210 from EMI and/or RFI emanating from other sources. Further, the HDS 100 is configured to transfer and dissipate heat emanating from the SC 210. Preferably, when the shield base 110 is connected to a conductive layer (not shown) in the PCB 200, the HDS 100 is thereby electrically grounded. More specifically, the HDS 100 and each of its components, the shield base 110, the shield cap 130, and the heat sink 150, are likewise electrically grounded. In such a configuration the HDSs illustrated and described herein may have the structure of a Faraday cage, especially where the PCB 200 has a ground plane (not shown) and the SC 210 is between the HDS 100 and the ground plane.

Figure 3:
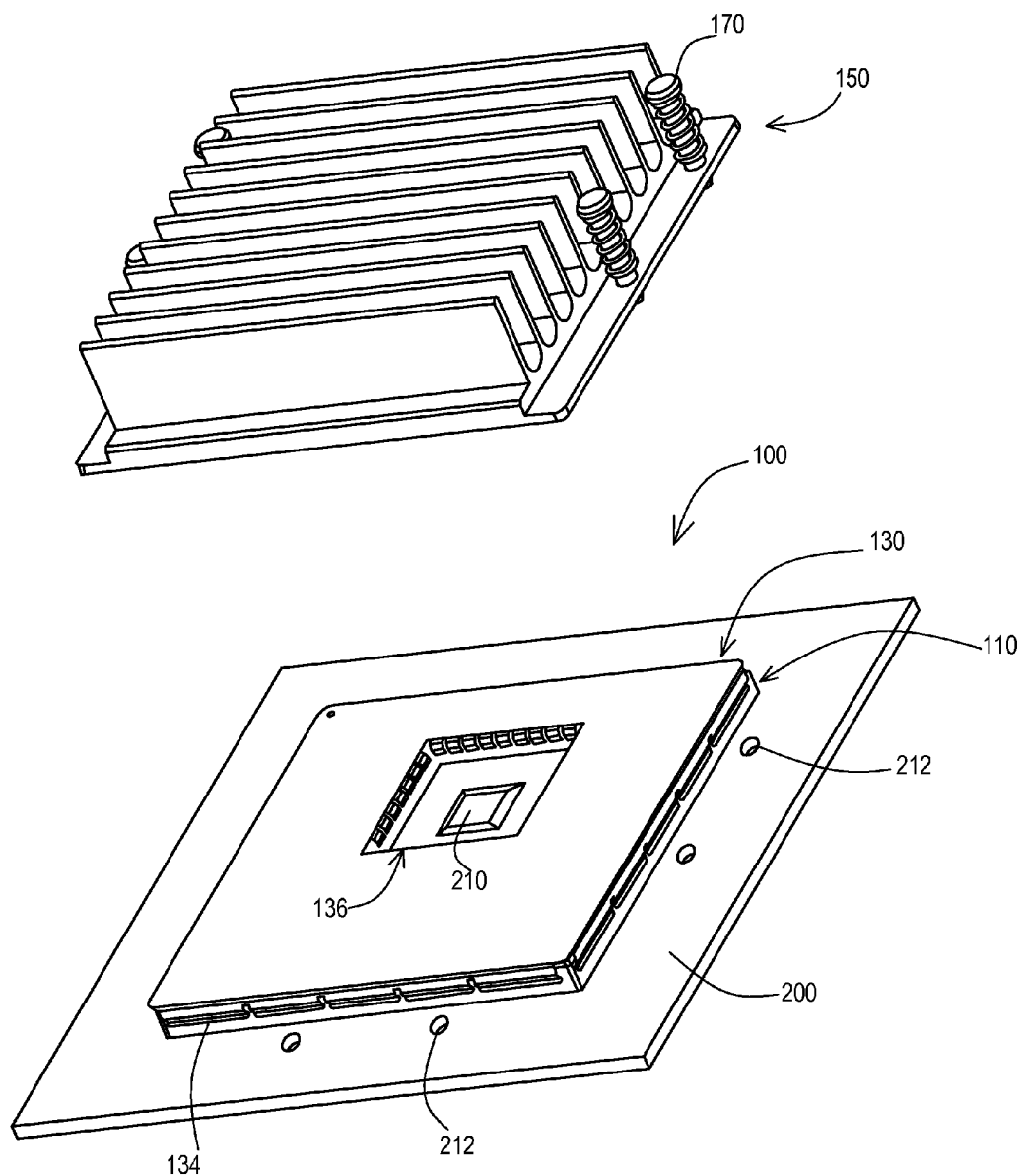
FIG. 3 is a perspective diagram showing the partially assembled heat-dissipating EMI/RFI shield of FIG. 1.

FIG. 3 is a perspective diagram showing the partially assembled heat-dissipating EMI/RFI shield 100 of FIG. 1. The shield cap 130 is shown mounted to the shield base 110, such that the plurality of leafs 134 are engaging a respective plurality of sidewall apertures 116. The shield cap 130 may thereby be structurally and electrically connected, and grounded, to the shield base 110 and PCB 200.

Figure 4:
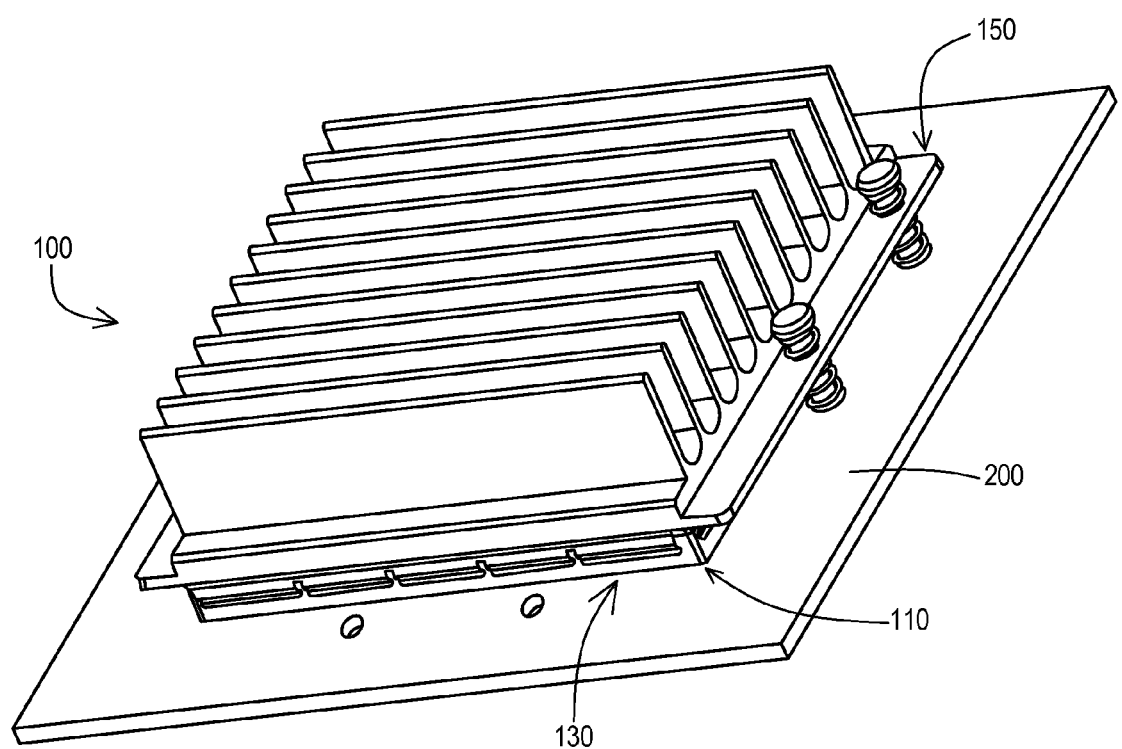
FIG. 4 is a top view perspective diagram showing an assembled heat-dissipating EMI/RFI shield of FIG. 1.

FIG. 4 is a top view perspective diagram showing an assembled heat-dissipating EMI/RFI shield 100 of FIG. 1. As illustrated in FIGS. 1A-4, the heat sink 150 is approximately the same size as the shield base 110 and the shield top 130.

Figure 5:
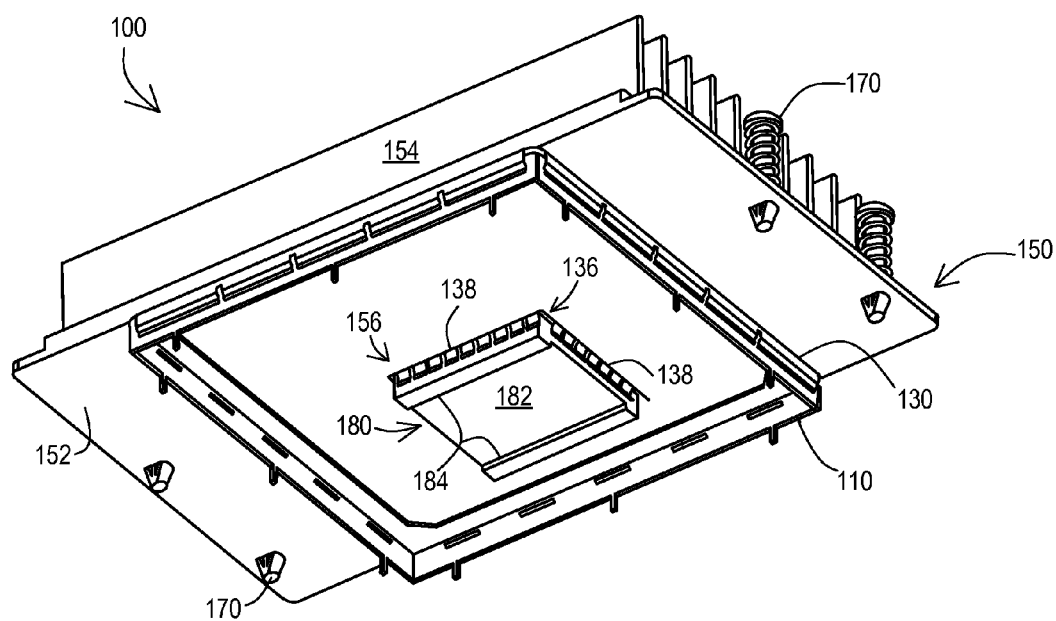
FIGS. 5 and 6 are bottom and top view perspective diagrams, respectively, showing another exemplary heat-dissipating EMI/RFI shield.
Figure 6:
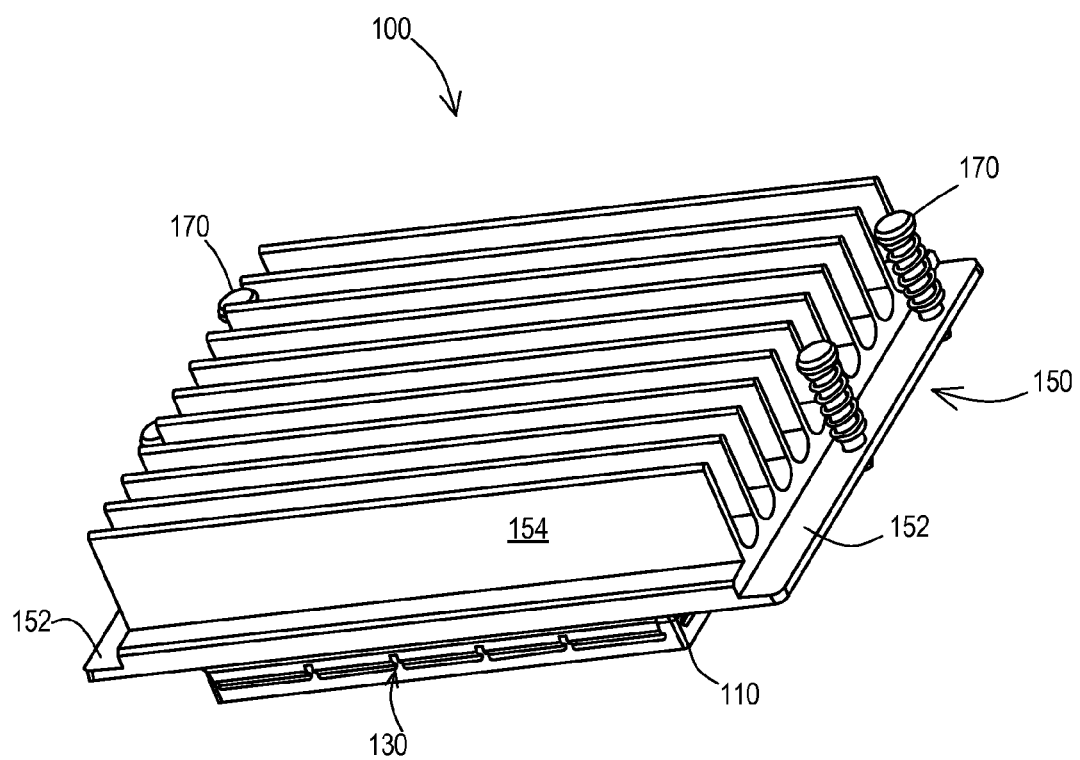

FIGS. 5 and 6 are bottom and top view perspective diagrams, respectively, showing another exemplary heat-dissipating EMI/RFI shield 100. In this alternative embodiment, the heat sink 150 is wider than the shield cap 130 and shield base 110 in two directions, that is, the platform 152 and fins 154 of the heat sink 150 overhang the shield cap 130 and shield base 110 on two sides. Although the overhang is shown as being on two opposing sides, the heat sink 150 may be wider than, and overhang, the shield cap 130 or shield base 110 in one or more directions, and any of the sides may be overhanging sides.

Figure 7:
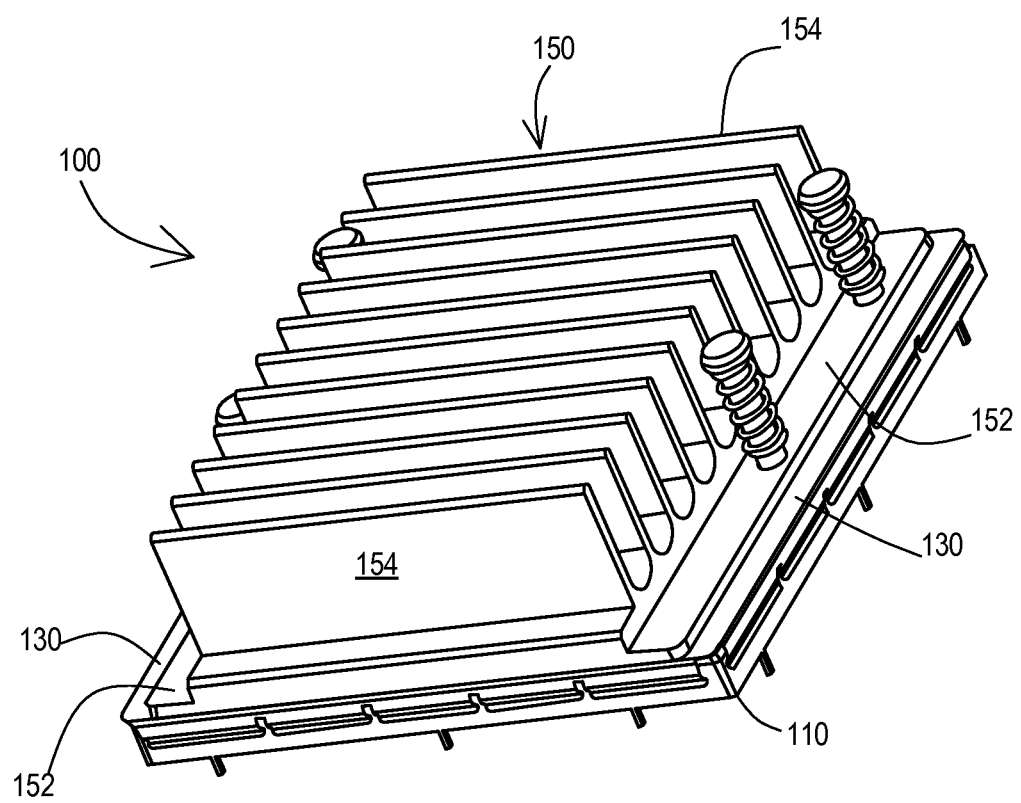
FIG. 7 is a perspective diagram showing another exemplary heat-dissipating EMI/RFI shield.

FIG. 7 is a perspective diagram showing another exemplary heat-dissipating EMI/RFI shield 100. In this alternative embodiment, the heat sink 150 is narrower than the shield cap 130 and shield base 110 in two directions, that is, the platform 152 and fins 154 are inset or indented from the shield cap 130 and shield base 110 on two sides. Although the indentation is shown as being on two opposing sides, the heat sink 150 may be narrower than the shield cap 130 or shield base 110 in one or more directions, and any of the sides may be inset sides.

Figure 8:
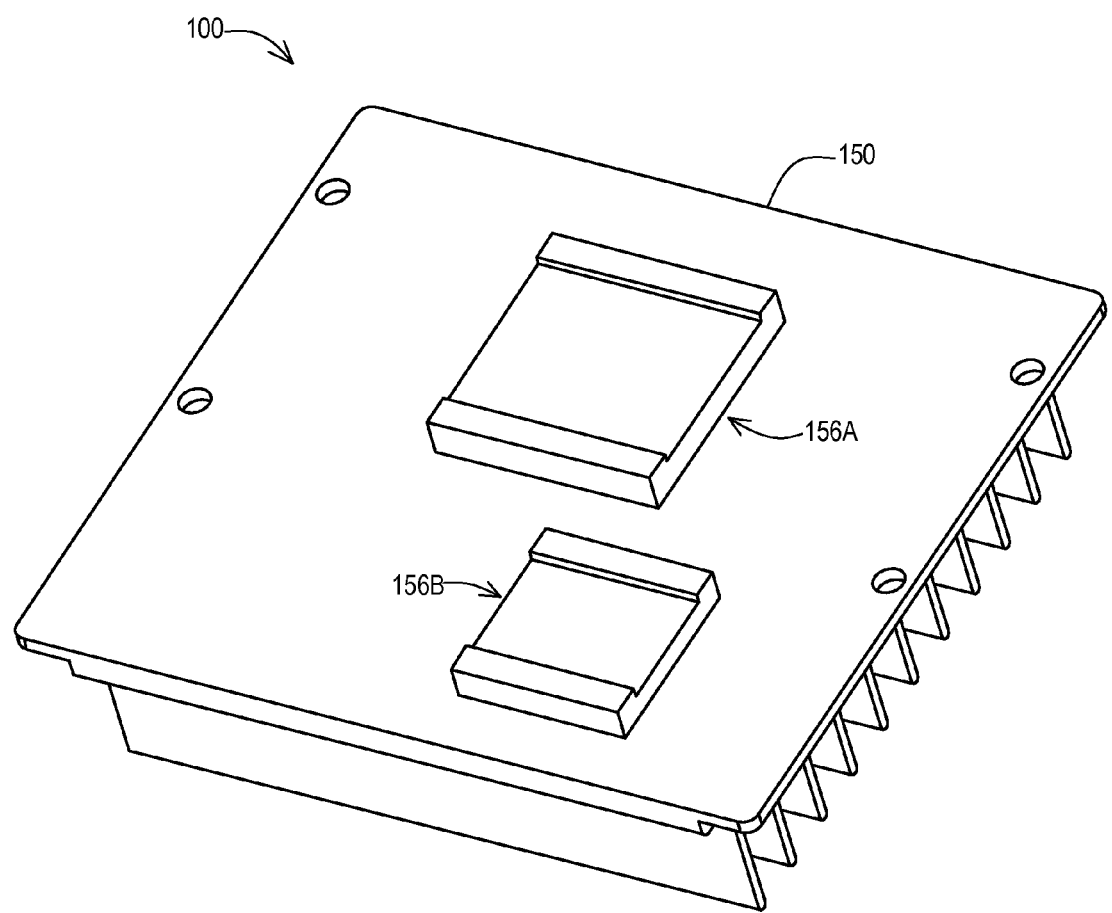
FIG. 8 is a perspective diagram showing another exemplary heat-dissipating EMI/RFI shield.

FIG. 8 is a perspective diagram showing another exemplary heat-dissipating EMI/RFI shield 150. In this an alternative embodiment, the heat sink 150 comprises a plurality of shoes 156 (156A, 156B). The shoes 156 may be of different and various sizes, configurations and positions to further allow for close tolerances between, and contact with, their respective SCs 210 (not shown in FIG. 8).

Although the shield base 110, the shield cap 130, and the heat sink 150 have been illustrated as being generally square, this is for purposes of convenience of illustration. These components may be any other shape appropriate, desired, or convenient for a particular SC 210 and/or device including a PCB 200 such as, by way of example and not of limitation, a rectangle, a triangle, a circle, or a polygon. While a square, rectangle or polygon is generally considered as having sides, if a component or opening or area is circular, or some other continuous shape, such a component shape may be considered as having either a single side or a plurality of sides.

Figure 9:
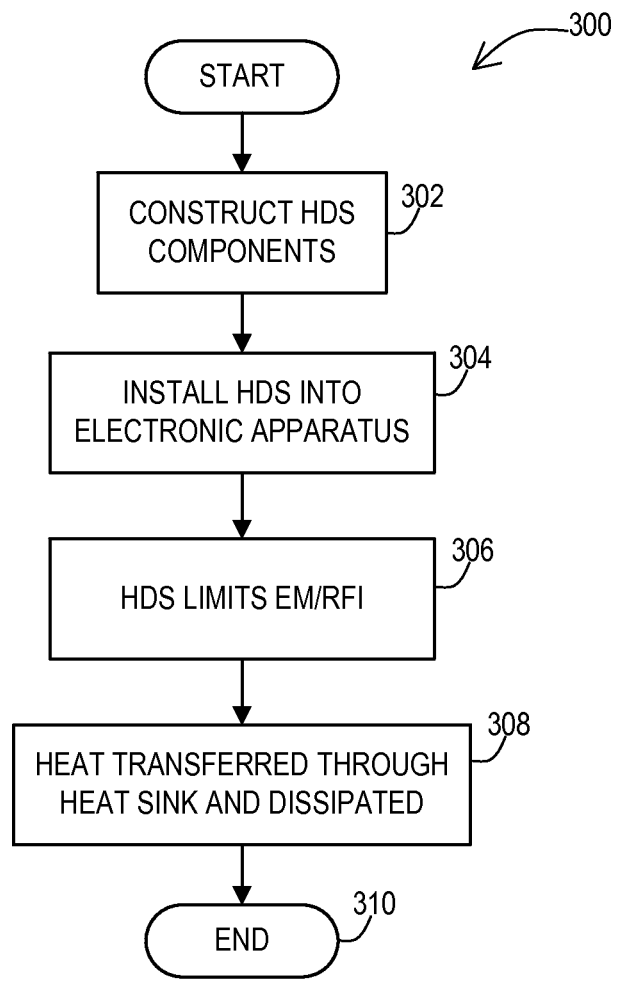
FIG. 9 is a logical flow diagram illustrating a process for manufacturing, assembling, and utilizing an exemplary heat-dissipating EMI/RFI shield.

FIG. 9 is a logical flow diagram illustrating a process for manufacturing, assembling, and utilizing an exemplary heat-dissipating EMI/RFI shield 100. It should be appreciated that the operations described herein can be implemented as a sequence of manufacturing steps, mechanical operations, and physical processes. The implementation may vary depending on the performance and other requirements of a particular manufacturing system or electronic device in which an HDS is utilized. It should also be appreciated that more or fewer operations may be performed than shown in the Figures and described herein. These operations may also be performed in parallel, or in a different order than those described herein.

The process 300 can begin with operation 302 where an appropriate manufacturing procedure is utilized to construct the HDS components; namely, the shield base 110, shield cap 130, heat sink 150, and engaging components 170. From operation 302, the routine 300 proceeds to operation 304, where the HDS 100 is installed into any type of electronic apparatus. As discussed herein, the HDS 100 may be installed onto a circuit board utilized in an electronic device. More particularly, the shield base 110 is installed onto the PCB 200 and then reflow-soldered to affix it to the PCB. The open area 113 of the shield base 110 and, to a lesser degree, the optional apertures 116, allows adequate hot air flow for resoldering operations. The shield top 130 is then fitted (pressed) onto the shield base 110. The heat sink 150 is then mounted on top of the shield top 130, with the boss 156 protruding through the collar 136 and making thermal contact with the SC 210. The pins 170, or other desired fasteners, are then used to secure the heat sink 150 to the PCB 200. The assembly 100 is therefore fully installed. The routine 300 then proceeds to operation 306.

At operation 306 the SC 210 is operational, and emits EMI and/or RFI. The HDS 100 contains the EMI and/or RFI in that the HDS 100 substantially prevents the EMI and/or RFI for emitting beyond the shield base 110 and/or shield cap 130. Similarly, the HDS substantially prevents EMI and/or RFI emanating from other sources from affecting the SC 210. The routine 300 proceeds to operation 308.

At operation 308, as the SC 210 operates, it emits heat and may generate EMI/RFI. Heat from the SC 210 is transferred to the heat sink 150 and dissipated. The routine 300 then continues to operation 310, where it ends after the SC 210 is turned off and the heat is dissipated.

Based on the foregoing, it should be appreciated that heat-dissipating EMI/RFI shields have been disclosed herein. Although the subject matter presented herein has been described in language specific to systems, methodological acts, mechanical and physical operations, and manufacturing processes, it is to be understood that the concepts disclosed herein are not necessarily limited to the specific features, acts, or media described herein. Rather, the specific features, acts and mediums are disclosed as example forms.

The subject matter described herein is provided by way of illustration for the purposes of teaching, suggesting, and describing, and not limiting or restricting. Combinations and alternatives to the illustrated embodiments are contemplated, described herein, and set forth in the claims. Various modifications and changes may be made to the subject matter described herein without strictly following the embodiments and applications illustrated and described, and without departing from the scope of the following claims.

The invention claimed is:

1. A heat-dissipating EMI/RFI shield, wherein the heat-dissipating EMI/RFI shield is to be attached to a circuit board having engaging structures and a heat-generating component, the heat-dissipating EMI/RFI shield comprising:
    a shield base having a plurality of sidewalls which define an open area, each sidewall having at least one engaging structure, and a plurality of legs extending from the sidewalls;
    a shield cap having a collar and a plurality of flanges, the collar defining an opening in the shield cap and having a plurality of fingers or springs extending therefrom, each flange having at least one leaf extending therefrom, the leaves being configured to mate with engaging structures of the shield base to secure the shield cap to the shield base;
    a heat sink having a boss extending therefrom, a plurality of heat-dissipating fins extending therefrom, and a plurality of platforms, each platform extending from a side of the heat sink, the boss being configured to protrude at least partially into the opening in the shield cap and to make thermal contact with the heat-generating component, the heat sink being configured to be mated to the shield cap, each platform having at least one aperture therein; and
    a plurality of engaging components configured to be inserted into the apertures of the platform and into the apertures in the circuit board to attach the heat-dissipating EMI/RFI shield to the circuit board;
    wherein the plurality of fingers of the collar of the shield cap contact the boss of the heat sink when the heat sink is mated with the shield cap.

2. The heat-dissipating EMI/RFI shield of claim 1 wherein the heat sink has at least one dimension which is different than a corresponding dimension of at least one of the shield cap or the shield base.

3. A heat-dissipating EMI/RFI shield, comprising:
a shield base having a plurality of sidewalls which define an open area, each sidewall having at least one engaging structure, and a plurality of legs extending from the sidewalls
a shield cap having a collar which defines an opening in the shield cap, the shield cap being configured to be mated to the shield base; and
a heat sink having a boss extending therefrom, the boss being configured to protrude at least partially into the opening in the shield cap, the heat sink being configured to be mated to the shield cap;
wherein the collar of the shield cap has a plurality of fingers which contact the boss of the heat sink when the heat sink is mated with the shield cap.

4. The heat-dissipating EMI/RFI shield of claim 3 wherein the at least one sidewall of the shield base has at least one engaging structure, the engaging structure being configured to secure the shield cap to the shield base.

5. The heat-dissipating EMI/RFI shield of claim 3 wherein the shield base has a plurality of sidewalls which define the open area, at least some of the sidewalls having at least one engaging structure therein which is configured to secure the shield cap to the shield base.

6. The heat-dissipating EMI/RFI shield of claim 3 wherein:
the shield cap has at least one flange which has a plurality of leaves extending therefrom; and
the at least one sidewall of the shield base has a plurality of engaging structures, the engaging structures being configured to mate with the leaves to secure the shield cap to the shield base.

7. The heat-dissipating EMI/RFI shield of claim 3 wherein:
the shield cap has a plurality of flanges, each flange having at least one leaf extending therefrom;
the shield base has a plurality of sidewalls, each sidewall having at least one engaging structure configured to mate with the at least one leaf to secure the shield cap to the shield base.

8. The heat-dissipating EMI/RFI shield of claim 3 wherein the heat sink has a plurality of heat dissipating fins extending therefrom.

9. The heat-dissipating EMI/RFI shield of claim 3 wherein the heat-dissipating EMI/RFI shield is to be attached to a circuit board having apertures, and wherein:
the heat sink comprises a platform on at least two sides, each platform having at least one aperture; and
the heat-dissipating EMI/RFI shield further comprises a plurality of engaging components configured to be inserted into the apertures of the heat sink and into the apertures in the circuit board to attach the heat-dissipating EMI/RFI shield to the circuit board.

10. The heat-dissipating EMI/RFI shield of claim 3 wherein the heat sink has approximately a same area and shape as the shield cap or the shield base.

11. The heat-dissipating EMI/RFI shield of claim 3 wherein the heat sink overhangs at least one of the shield cap or the shield base.

12. The heat-dissipating EMI/RFI shield of claim 3 wherein the heat sink has at least one dimension which is smaller than a corresponding dimension of at least one of the shield cap or the shield base.

13. The heat-dissipating EMI/RFI shield of claim 3 wherein the heat-dissipating EMI/RFI shield is to be attached to a circuit board having a heat-generating component thereon and the boss makes thermal contact with the heat-generating component.

14. The heat-dissipating EMI/RFI shield of claim 3 wherein the heat-dissipating EMI/RFI shield is to be attached to a circuit board having a grounding component and at least one leg of the shield base is soldered to the grounding component.

15. The heat-dissipating EMI/RFI shield of claim 3 wherein the heat-dissipating EMI/RFI shield is to be attached to a circuit board having a plurality of heat-generating components thereon, and wherein the heat sink comprises a plurality of bosses, each boss making thermal contact with a corresponding one of the heat-generating components.

* * * * *